(12) United States Patent
Huang et al.

(10) Patent No.: US 12,557,706 B2
(45) Date of Patent: Feb. 17, 2026

(54) PIXEL PACKAGE AND MANUFACTURING METHOD THEREOF

(71) Applicants: Yenrich Technology Corporation, Hsinchu (TW); EPISTAR CORPORATION, Hsinchu (TW)

(72) Inventors: Li-Yuan Huang, Hsinchu (TW); Tzu-Hsiang Wang, Hsinchu (TW); Chi-Chih Pu, Hsinchu (TW); Ya-Wen Lin, Hsinchu (TW); Pei-Yu Li, Hsinchu (TW); Hsiao-Pei Chiu, Hsinchu (TW)

(73) Assignees: Yenrich Technology Corporation, Hsinchu (TW); Epistar Corporation, Hsinchu (TW)

( * ) Notice: Subject to any disclaimer, the term of this patent is extended or adjusted under 35 U.S.C. 154(b) by 318 days.

(21) Appl. No.: 18/200,429

(22) Filed: May 22, 2023

(65) Prior Publication Data
US 2023/0378142 A1 Nov. 23, 2023

(30) Foreign Application Priority Data
May 23, 2022 (TW) .................................. 111119121

(51) Int. Cl.
*H01L 25/075* (2006.01)
*H10H 20/831* (2025.01)
(Continued)

(52) U.S. Cl.
CPC ....... *H01L 25/0753* (2013.01); *H10H 20/831* (2025.01); *H10H 20/857* (2025.01); *H10H 20/032* (2025.01); *H10H 20/0364* (2025.01)

(58) Field of Classification Search
CPC . H01L 25/0753; H01L 25/167; H01L 23/293; H01L 23/3185; H01L 23/528;
(Continued)

(56) References Cited

U.S. PATENT DOCUMENTS 11,251,350 B2 * 2/2022 Lin ...................... H01L 21/568
12,237,317 B2 * 2/2025 Shi ...................... H01L 25/0753
(Continued)

FOREIGN PATENT DOCUMENTS

| CN | 114188372 A | 3/2022 |
|---|---|---|
| KR | 10-2019-0137458 A | 12/2019 |
| TW | 202213311 A | 4/2022 |

*Primary Examiner* — Ibrahim A Khan
(74) *Attorney, Agent, or Firm* — Patterson + Sheridan, LLP (57) ABSTRACT

A pixel package includes a base material, a circuit structure, light-emitting semiconductor elements, a non-light-emitting semiconductor element, and a light-transmitting adhesive layer. The base material has an upper surface, a lower surface, and a side surface. The circuit structure is buried in the base material and includes an first circuit layer exposed from the upper surface, bottom electrodes exposed from the lower surface, and a middle circuit layer between the upper circuit layer and the plurality of bottom electrodes and covered by the base material. The light-emitting semiconductor elements are on the upper surface and electrically connected to the circuit structure. The non-light-emitting semiconductor element is buried in the base material and directly connected to the middle circuit layer, and at least one outside surface is exposed. The light-transmitting adhesive layer covers the light-emitting semiconductor elements and is in direct contact with the base material.

15 Claims, 9 Drawing Sheets

(51) Int. Cl.
*H10H 20/857* (2025.01)
*H10H 20/01* (2025.01)

(58) Field of Classification Search
CPC .. H10H 20/831; H10H 20/857; H10H 20/032; H10H 20/0364; H10H 20/01; H10H 20/85; H10H 20/854; H10H 29/142; H10H 20/0362; H10H 20/855; H10D 86/441; H10D 86/60
See application file for complete search history.

(56) References Cited

U.S. PATENT DOCUMENTS

| | | | |
|---|---|---|---|
| 2015/0008462 A1* | 1/2015 | Weng | H01L 24/97 |
| | | | 438/27 |
| 2016/0363723 A1* | 12/2016 | Choi | G02B 6/0091 |
| 2017/0154947 A1* | 6/2017 | Nakamura | H10K 59/8722 |
| 2019/0198455 A1* | 6/2019 | Hartner | H05K 1/0243 |
| 2019/0371779 A1 | 12/2019 | Yeon et al. | |
| 2019/0392751 A1* | 12/2019 | Hsieh | H01L 21/02263 |
| 2020/0194417 A1* | 6/2020 | Yeon | H10H 29/10 |
| 2020/0203302 A1* | 6/2020 | Chew | H01L 24/73 |
| 2020/0227395 A1* | 7/2020 | Shi | H10H 29/142 |
| 2020/0295243 A1* | 9/2020 | Kuo | H10H 20/854 |
| 2020/0328248 A1* | 10/2020 | Matsugai | B29C 39/10 |
| 2021/0272945 A1* | 9/2021 | Lin | H01L 24/25 |
| 2021/0398479 A1* | 12/2021 | Kim | H01L 24/49 |
| 2022/0163861 A1* | 5/2022 | Song | F21K 9/69 |
| 2023/0186795 A1* | 6/2023 | Wu | H10H 20/8506 |
| | | | 257/79 |

* cited by examiner

FIG. 13B ent application, and is incorporated by reference herein.

PIXEL PACKAGE AND MANUFACTURING METHOD THEREOF

CROSS REFERENCE TO RELATED APPLICATIONS

This application claims priority of TW Patent Application No. 111119121, filed on May 23, 2022, the entirety of which is incorporated by reference herein.

BACKGROUND OF THE APPLICATION

Field of the Disclosure

The present disclosure is related to a pixel package and a manufacturing method thereof, and, in particular, it is related to a pixel package embedded with a non-light-emitting semiconductor element and a manufacturing method thereof.

Description of the Related Art

Figure 1:
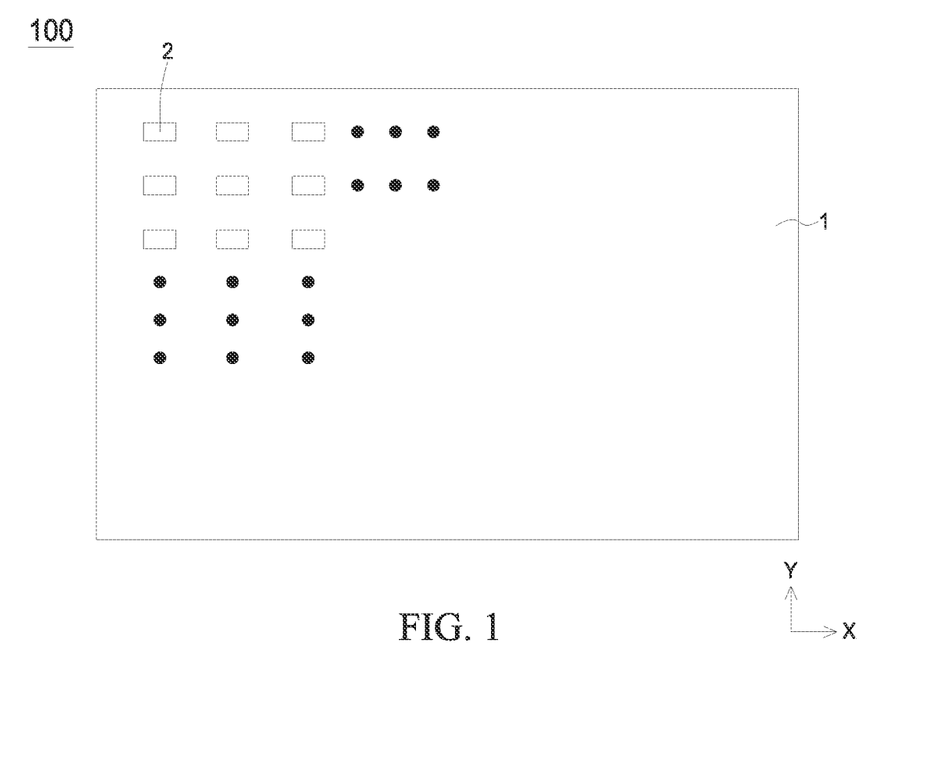
FIG. 1 shows a conventional LED display device.

Light-emitting diodes are monochromatic light semiconductor elements. The light-emitting diodes are used as light-emitting elements of the pixel in the display screen to easily increase the color gamut and brightness of large screens. As shown in FIG. 1, the display device 100 includes a circuit carrier board 1 and a plurality of pixels 2 arranged in an array on the carrier 1, and each of the plurality of pixels 2 includes one group of red, blue, and green light-emitting diodes. The circuit carrier board 1 is disposed with a control chip (not shown), and the control chip receives external signals and controls the operation of the pixels.

Figure 2A:
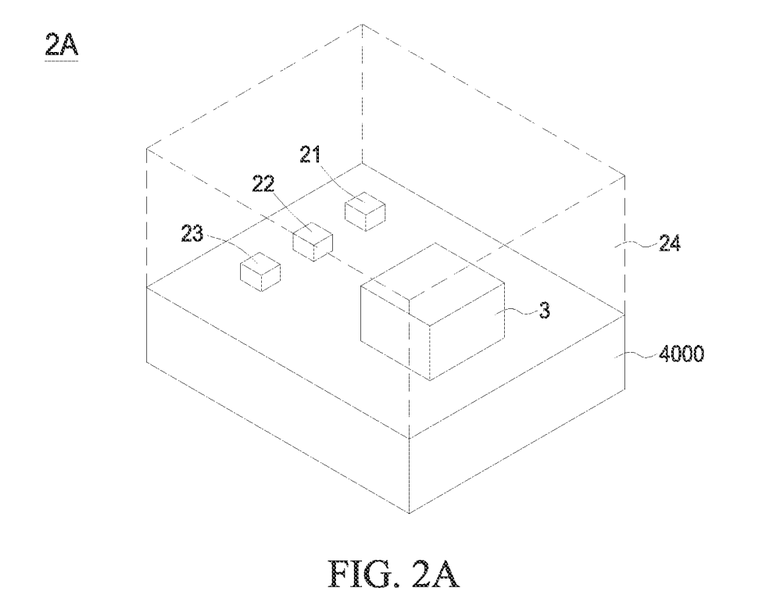
FIGS. 2A and 2B show a conventional pixel package having a control chip.
Figure 2B:
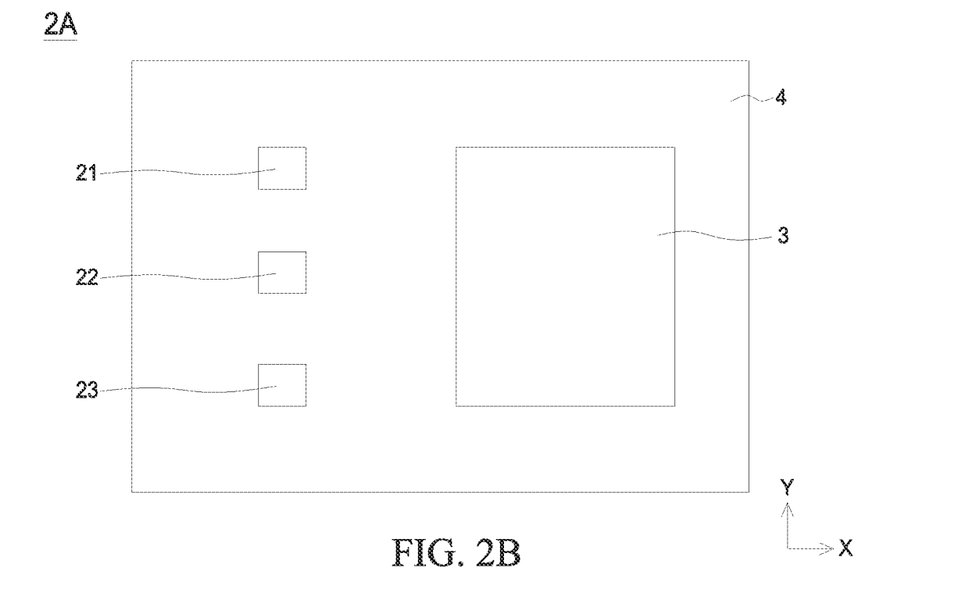

FIGS. 2A and 2B show a conventional pixel package 2A having a control chip. FIG. 2A shows a perspective view of the pixel package 2A, and FIG. 2B shows a top view of the pixel package 2A. The pixel package 2A includes a circuit board 4000, a group of light-emitting diodes 21, 22, and 23 for emitting red, blue, and green light, a control chip 3, and a light-transmitting protective layer 24. The control chip 3 and the light-emitting diodes 21, 22, and 23 are respectively disposed on opposite sides of the circuit board 4000. The light-transmitting protective layer 24 covers the light-emitting diodes 21, 22, and 23 and the control chip 3. The height, width, and length of the control chip 3 are usually more than twice that of one light-emitting diode. Therefore, the control chip 3 blocks the light emitted from the light-emitting diodes 21, 22, and 23 in the X direction (FIG. 2B), which results in the light pattern from the pixel package 2A deviating to one side. If the pixel package 2A is used as the pixel 2 in FIG. 1, the image quality of the display 100 is degraded and a good viewing experience cannot be provided due to the deviation of the light pattern from the pixel package 2A.

BRIEF SUMMARY OF THE DISCLOSURE

A pixel package includes a base material, a circuit structure, a plurality of light-emitting semiconductor elements, a non-light-emitting semiconductor element, and a light-transmitting adhesive layer. The base material has an upper surface, a lower surface, and a side surface between the upper surface and the lower surface. The circuit structure is buried in the base material and includes an upper circuit layer exposed from the upper surface, a plurality of bottom electrodes exposed from the lower surface, and a lower circuit layer between the first circuit layer and the plurality of lower electrodes and covered by the base material. The plurality of light-emitting semiconductor elements is on the upper surface and electrically connected to the circuit structure. The non-light-emitting semiconductor element is buried in the base material and directly connected to the middle circuit layer, and at least one outside surface is exposed. The light-transmitting adhesive layer covers the plurality of light-emitting semiconductor elements and is in direct contact with the base material.

BRIEF DESCRIPTION OF THE DRAWINGS

FIGS. 9 to 13A show a manufacturing process of the pixel package according to an embodiment.

DETAILED DESCRIPTION OF THE DISCLOSURE

Figure 3:
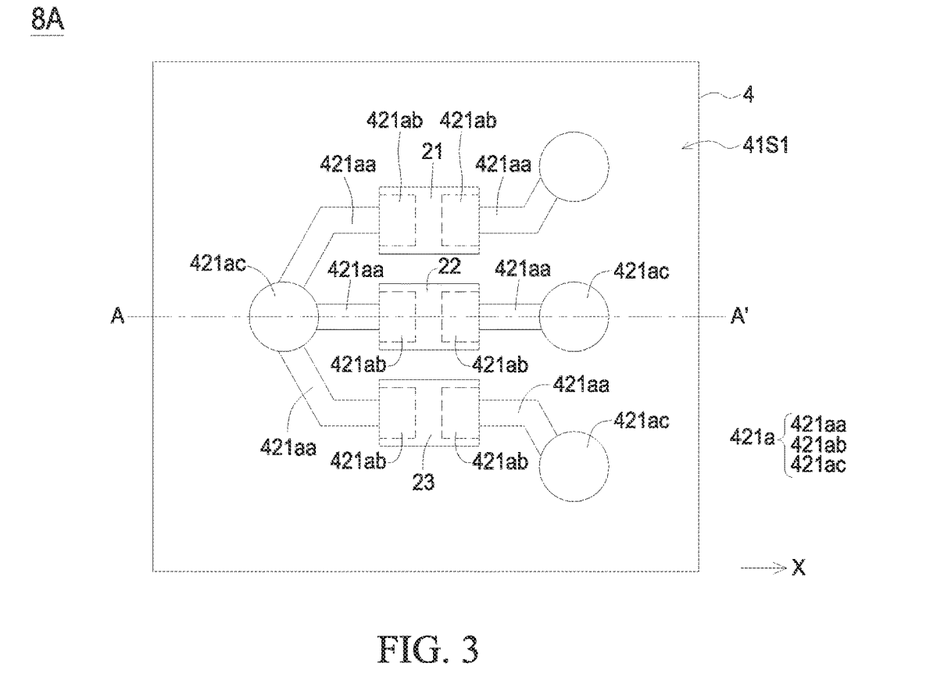
FIG. 3 shows a top view of a pixel package 8A according to an embodiment.
Figure 4:
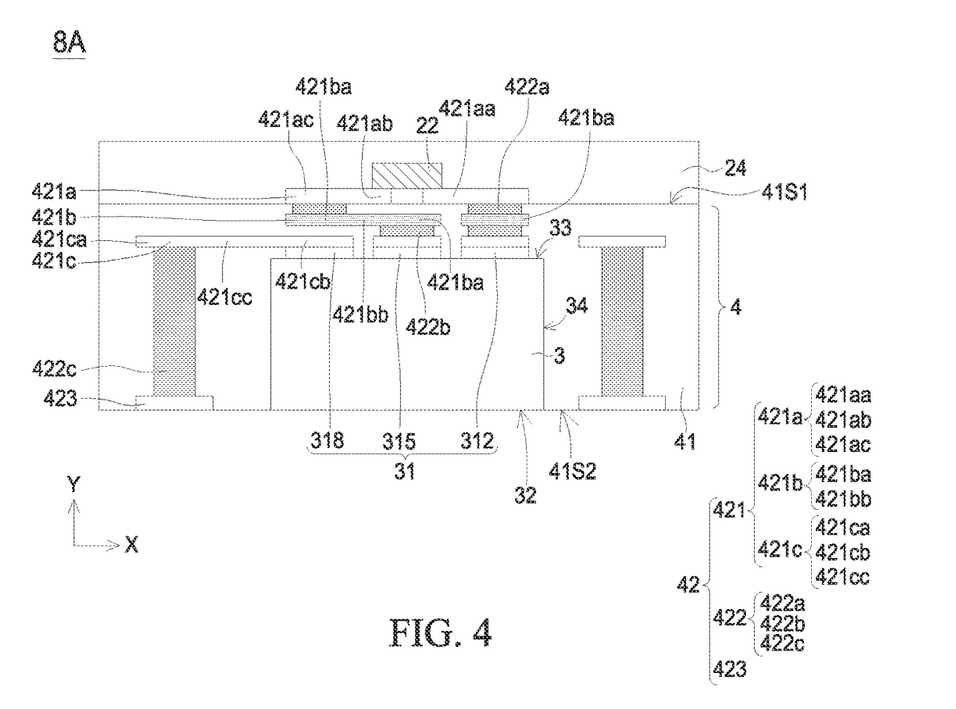
FIG. 4 shows a cross-sectional view of the pixel package 8A along line AA' in FIG. 3.
Figure 5:
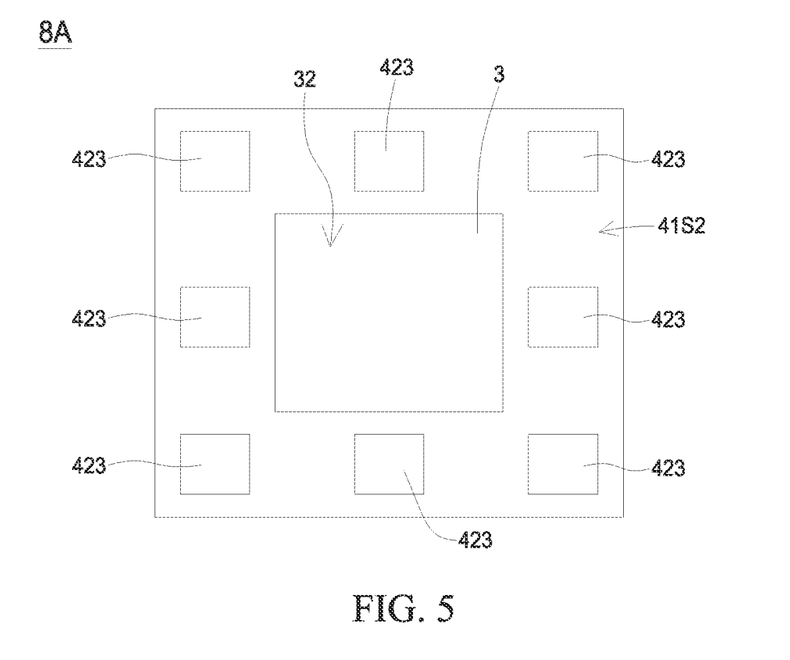
FIG. 5 shows a bottom view of the pixel package 8A.

According to an embodiment, FIGS. 3 to 5 show a pixel package 8A embedded with a control chip. FIG. 3 shows a top view of the pixel package 8A, FIG. 4 shows a cross-sectional view of the pixel package 8A along the line AA' in FIG. 3, and FIG. 5 shows a bottom view of the pixel package 8A. As shown in FIG. 3, the pixel package 8A includes one group of light-emitting diodes 21, 22, and 23. The light-emitting diodes 21, 22, and 23 are in a middle region of an upper surface 41S1 of an embedded substrate 4 and may respectively emit red, blue, and green light. As shown in FIG. 4, the pixel package 8A includes the embedded substrate 4, the light-emitting diodes 21, 22, and 23, a light-transmitting protective layer 24, and a control chip 3. The light-emitting diodes 21, 22, and 23 are disposed on the embedded substrate 4. The light-transmitting protective layer 24 is disposed on the upper surface 41S1 of the substrate 4 and covers the light-emitting diodes 21, 22, and 23. The control chip 3 is embedded in the embedded substrate 4 and electrically connected to the light-emitting diodes 21, 22, and 23 through the circuit structure 42 in the embedded substrate 4. FIG. 5 shows a bottom view of the pixel package 8A. A plurality of bottom electrodes 423 and the control chip 3 are exposed from the lower surface 41S2 of the embedded substrate 4. The plurality of bottom electrodes 423 introduces external signals and power to the control chip 3 and the light-emitting diodes 21, 22, and 23 for the control chip 3 to output power to the light-emitting diodes 21, 22, and 23 according to the instructions of the external signal, so as to control the time and intensity of the red, blue, and green light emitted by the light-emitting diodes 21, 22, and 23.

In an embodiment, the number of the light-emitting diodes 21, 22, and 23 is three, and, in another embodiment, the number of the light-emitting diodes may be more than three. In an embodiment, the light-emitting diodes 21, 22, and 23 are light-emitting diode dies that may emit light of different wavelengths or colors, and respectively have a p-type semiconductor layer, an n-type semiconductor layer, a light-emitting layer between the p-type semiconductor layer and the n-type semiconductor layer, a p-electrode connected to the p-type semiconductor layer, and an n-electrode connected to the n-type semiconductor layer. The p-electrode and n-electrode introduce current to make the light-emitting layer emit light. In an embodiment, the light-emitting diode 21 is a red light-emitting diode die, which may emit a first light with a dominant wavelength or peak wavelength in a range of between 600 nm and 660 nm. The light-emitting diode 22 is a green light-emitting diode die, which may emit a second light with a dominant wavelength or peak wavelength in a range of between 510 nm and 560 nm. The light-emitting diode 23 is a blue light-emitting diode die, which may emit a third light with a dominant wavelength or peak wavelength in a range of between 430 nm and 480 nm. The structures of the light-emitting diodes 21, 22, and 23 are substantially the same, but the compositions of the p-type semiconductor layers, n-type semiconductor layers, and light-emitting layers are different. The material of the light-transmitting protective layer 24 may be resin, ceramic, glass, or a combination thereof, and the transmittance thereof to all wavelength bands of wavelengths from 430 nm to 480 nm, 510 nm to 560 nm, and 600 nm to 660 nm are greater than 50%.

As shown in FIG. 4, the embedded substrate 4 has the circuit structure 42 and a base material 41 covering the circuit structure 42 and the control chip 3. The base material 41 may be Ajinomoto Build-up Film (ABF), epoxy resin, bismaleimide triazine (BT) resin, or polyimide resin. In another embodiment, the base material 41 has a low coefficient of thermal expansion (CTE) in a range of between about 1 and 100 ppm/° C. For example, CTE of ABF is about 3~10 ppm/° C. and the CTE of BT resin is about 10~70 ppm/° C. The CTE difference between the base material 41 and the control chip 3 is less than 10 ppm/° C., wherein the CTE of the control chip 3 is about 3 ppm/° C., so as to improve the process yield of the pixel package 8A. If the difference between the CTE of the base material 41 and the CTE of the control chip 3 is too large, such as greater than 100 ppm/° C., when the process undergoes drastic temperature changes, such as the curing process of the base material 41, and the process of surface mount technology (SMT) for bonding the light-emitting diodes 21, 22, and 23 onto the embedded substrate 4, the interface between the base material 41 and the control chip 3 may have cracks which causes the embedded substrate 4 to fail. In an embodiment, the embedded substrate 4 is a coreless substrate, wherein the circuit structure 42 comprises a plurality of circuit layers 421, the base material 41 comprises a plurality of insulating layers, and the embedded substrate 4 is formed by alternately and sequentially stacking the plurality of circuit layers 421 and the plurality of insulating layers. When the base material 41 is ABF, the minimum line width/space (L/S) of the circuit structure 42 may reach 12/12 μm. The material of the circuit structure 42 may be a metal, such as copper, tin, aluminum, silver, gold, and a combination thereof.

Figure 7:
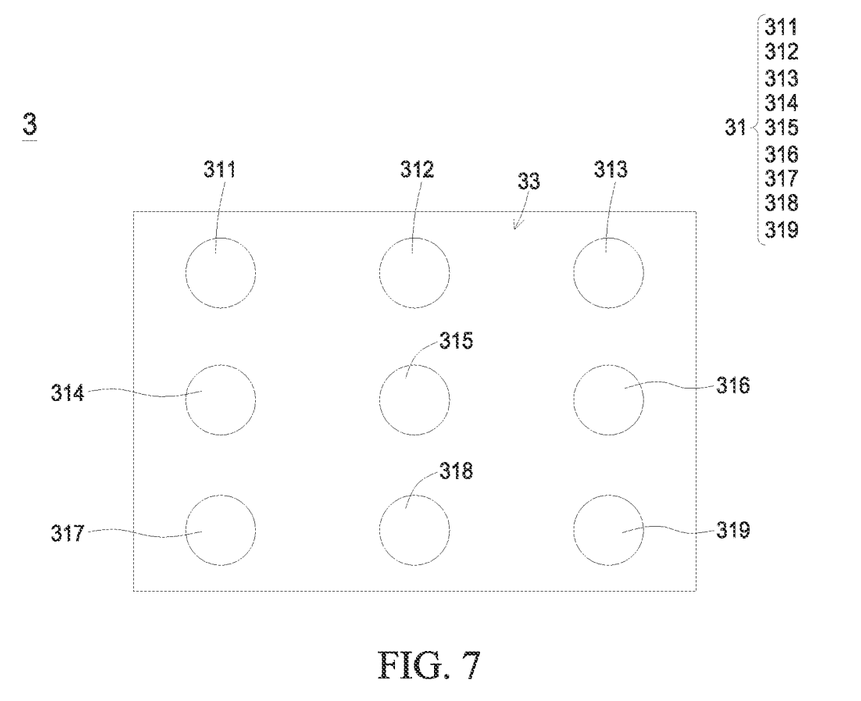
FIG. 7 shows an electrode array of the control chip.

As shown in FIG. 4, the control chip 3 has a bottom surface 32 exposed from the embedded substrate 4 and coplanar with the lower surface 41S2, a top surface 33 opposite to the bottom surface 32, and a plurality of side surfaces 34 between the bottom surface 32 and the top surface 33. The base material 41 of the embedded substrate 4 is in direct contact with and covers the plurality of side surfaces 34 and the top surface 33. The control chip 3 has a plurality of electrodes 31 on the top surface 33 and facing the light-emitting diodes 21, 22, and 23. In an embodiment, FIG. 7 shows the top surface 33 of the control chip 3 having 9 electrodes 31 arranged in an array on the top surface 33, wherein the number of electrodes 31 is not limited to 9, and may also be less than 9 or greater than 9. In FIG. 7, the profile of the electrode 31 is circular. In other embodiments, the profile of the electrode 31 may also be square, polygonal, or other shapes. Furthermore, the plurality of electrodes 31 in the array may have the same or different profiles. In one embodiment, the plurality of electrodes 31 includes electrodes 311, 312, 313, 314, 315, 316, 317, 318, and 319, wherein the electrodes 311, 312, and 313 are electrically connected to the p-electrodes of the light-emitting diodes 21, 22, and 23, respectively, and the electrode 315 is commonly electrically connected to the n-electrodes of the light-emitting diodes 21, 22, and 23. In another embodiment, the electrodes 311, 312, and 313 are electrically connected to the n-electrodes of the light-emitting diodes 21, 22, and 23, respectively, and the electrode 315 is commonly electrically connected to the p-electrodes of the light-emitting diodes 21, 22, and 23. The electrode 316 introduces a constant voltage ($V_{DD}$). The electrode 317 is used for grounding (GND). The electrode 318 can receive an external control signal (data input). The electrodes 319 and 314 are electrode positions reserved for expansion of functions of the control chip 3.

As shown in FIG. 4, the circuit structure 42 includes the plurality of circuit layers 421, a plurality of conductive pillars 422, and bottom electrodes 423. The plurality of circuit layers 421 includes upper circuit layer 421a, a middle circuit layer 421b and a lower circuit layer 421c. The plurality of conductive pillars 422 includes a plurality of first conductive pillars 422a, a plurality of second conductive pillars 422b, and a plurality of third conductive pillars 422c. The plurality of first conductive pillars 422a is between the upper circuit layer 421a and the middle circuit layer 421b. The plurality of second conductive pillars 422b is between the middle circuit layer 421b and the lower circuit layer 421c. The plurality of third conductive pillars 422c is between the lower circuit layer 421c and the bottom electrodes 423. As shown in FIGS. 3 and 4, the upper circuit layer 421a includes an electrode pair 421ab, a connection region 421ac, and a wiring 421aa connecting the connection region 421ac and the electrode pair 42 lab. As shown in FIG. 4, the middle circuit layer 421b and the lower circuit layer 421c are inside the embedded substrate 4, the middle circuit layer 421b includes a connection region 421ba and a wiring 421bb, and the lower circuit layer 421c includes a connection region 421cb and a wiring 421cc. As shown in FIGS. 3 and 4, the n-electrodes and p-electrodes of the light-emitting diodes 21, 22, and 23 are connected to the electrode pair 421ab through conductive adhesive or solder paste (not shown), and the connection region 421cb is connected to the electrodes 311, 312, 313, and 315 of the control chip 3. In the Y direction, the upper circuit layer 421a, the middle circuit layer 421b and the lower circuit layer 421c t overlap each other, the connection regions 421ac and 421ba are connected to each other by the first conductive pillars 422a, the connection regions 421ba and 421cb are connected to each other by the plurality of second conductive pillar 422b, and the n-electrodes (or p-electrodes) of the light-emitting diodes 21, 22, and 23 are electrically connected to the electrodes 311, 312, and 313 of the control chip 3 through the above arrangement. In an embodiment, the bottom electrodes 423 are coplanar with the bottom surface 32 of the control chip 3. In another embodiment, the bottom electrodes 423 are not coplanar with the bottom surface 32 of the control chip 3, wherein the bottom electrodes 423 may protrude from the lower surface 41S2. The bottom electrodes 423 are connected to the connection region 421*ca* by the plurality of third conductive pillars 422*c*.

As shown in FIG. 5, the plurality of bottom electrodes 423 surrounds the control chip 3. If the pixel package 8A is disposed on a circuit carrier (not shown) and is connected to the electrodes on the circuit carrier by the bottom electrodes 423, the evenly distributed bottom electrodes 423 may prevent the pixel package 8A from being tilted or askew during the bonding process, thereby avoiding the deviation of the light pattern emitted by the pixel package 8A. In an embodiment, both the circuit structure 42 and the control chip 3 are embedded in the base material 41 of the embedded substrate 4. That is, the base material 41 covers the upper circuit layer 421*a*, the middle circuit layer 421*b* and the lower circuit layer 421*c*, the bottom electrodes 423 (the bottom surface of the bottom electrode 423 is exposed from the base material 41), the plurality of first conductive pillars 422*a*, the plurality of second conductive pillars 422*b*, and the plurality of third conductive pillars 422*c*, and the control chip 3 (the bottom surface of the control chip 3 is exposed from the base material 41, and the side surfaces 34 and the top surface 33 are covered by the base material 41). During the manufacturing process of the embedded substrate 4, the circuit structure 42 is integrated with the control chip 3, therefore the procedure of adhering the control chip 3 onto the circuit substrate is omitted.

Figure 6:
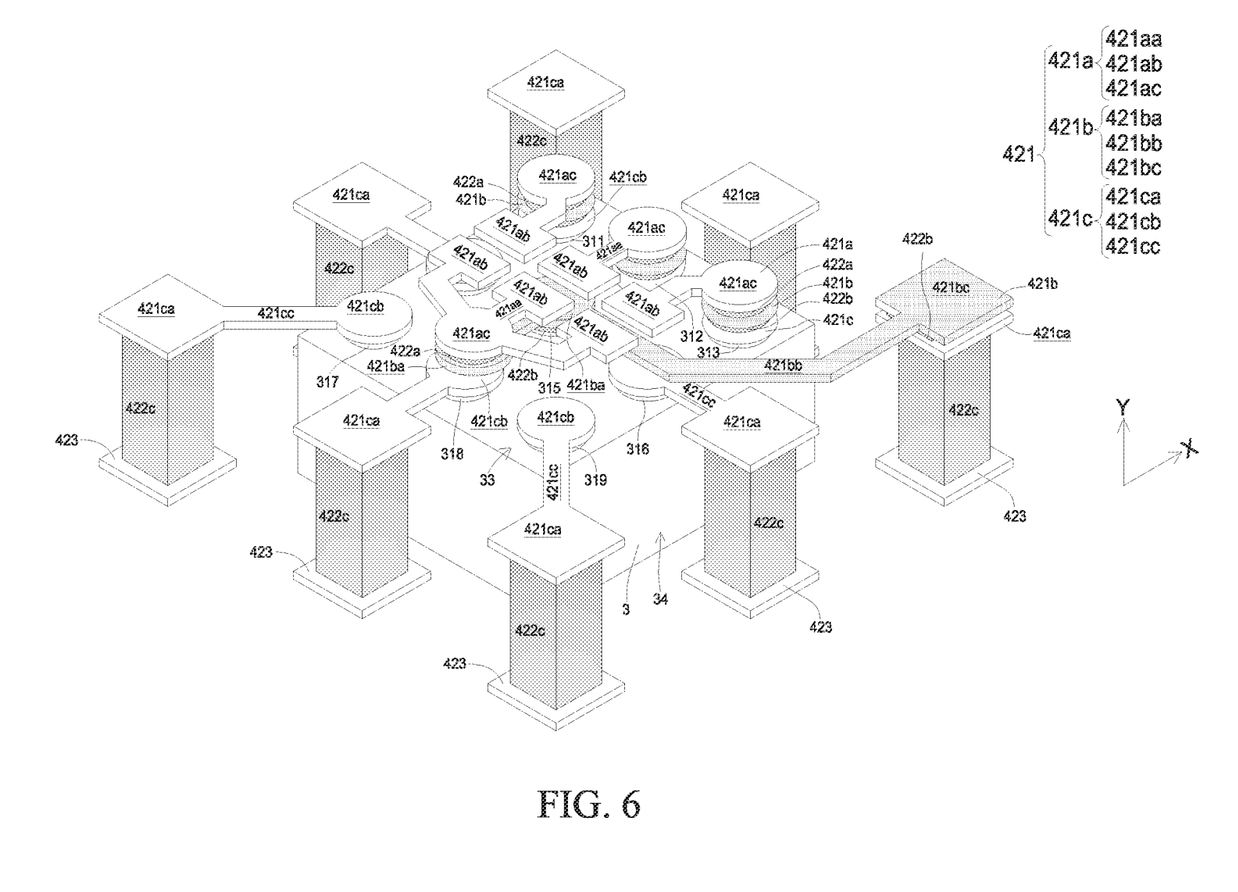
FIG. 6 shows a perspective view of the circuit structure and the control chip of the pixel package 8A.

FIG. 6 shows a perspective view of the connection structure of the circuit structure 42 and the control chip 3. As shown in FIG. 6, the upper circuit layer 421*a*, the middle circuit layer 421*b* and the lower circuit layer 421*c* have different (projected) patterns (as viewed from the Y direction). The middle circuit layer 421*b* has a connection region 421*bc*. The connection region 421*bc* is adjacent to a corner of the control chip 3 and is in a region outside the side surfaces 34 of the control chip 3. For example, the connection region 421*bc* does not overlap the control chip 3 along the Y direction. Despite that, the connection region 421*bc* overlaps one bottom electrodes 423 of the control chip 3 in the Y direction. The bottom electrode 423 electrically connected to the connection region 421*bc* may be used to introduce the VDD signal (power supply).

As shown in FIG. 6, the connection regions 421*cb* of the lower circuit layer 421*c* are disposed on the electrodes 311-319 of the control chip 3 and directly connected thereto. The lower circuit layer 421*c* has connection regions 421*ca* outside the side surfaces 34 of the control chip 3 (the connection region 421*ca* does not overlap the control chip 3 in the Y direction). In an embodiment, the wirings 421*cc* connects some of the connection regions 421*cb* and some of the connection regions 421*ca* one by one.

Figure 8:
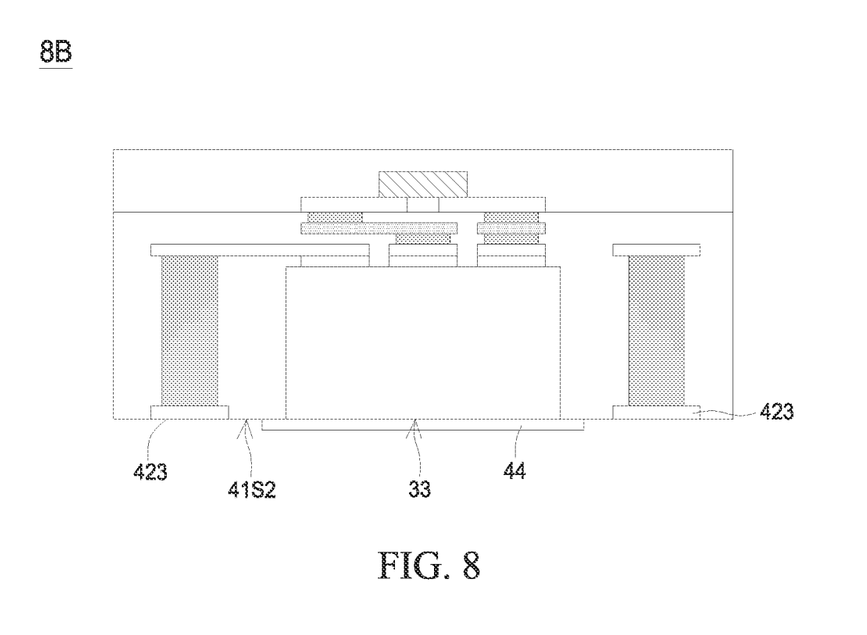
FIG. 8 shows a pixel package 8B embedded with the control chip according to another embodiment.

FIG. 8 shows a pixel package 8B according to another embodiment of the present disclosure. The pixel package 8B has a solder mask 44 covering the lower surface 41S2 and uncovering the bottom electrodes 423. The material of the solder mask 44 is insulating material, such as epoxy resin and polyimide resin.

In another embodiment, the pixel packages 8A and 8B may have a plurality of groups of light-emitting diodes 21, 22, and 23 and one control chip 3. The control chip 3 is connected to the plurality of groups of light-emitting diodes 21, 22, and 23 and controls the plurality of groups of light-emitting diodes 21, 22, and 23. In another embodiment, the pixel packages 8A and 8B may include a plurality of groups of light-emitting diodes 21, 22, and 23 and a plurality of control chips 3. The plurality of control chips 3 are connected to the plurality of groups of light-emitting diodes 21, 22, and 23 and controls the plurality of groups of light-emitting diodes 21, 22, and 23.

FIGS. 9 to 13A show the manufacturing process of the pixel package 8A according to another embodiment. FIGS. 9 to 13B show the manufacturing process of the pixel package 8B according to another embodiment.

Figure 9:
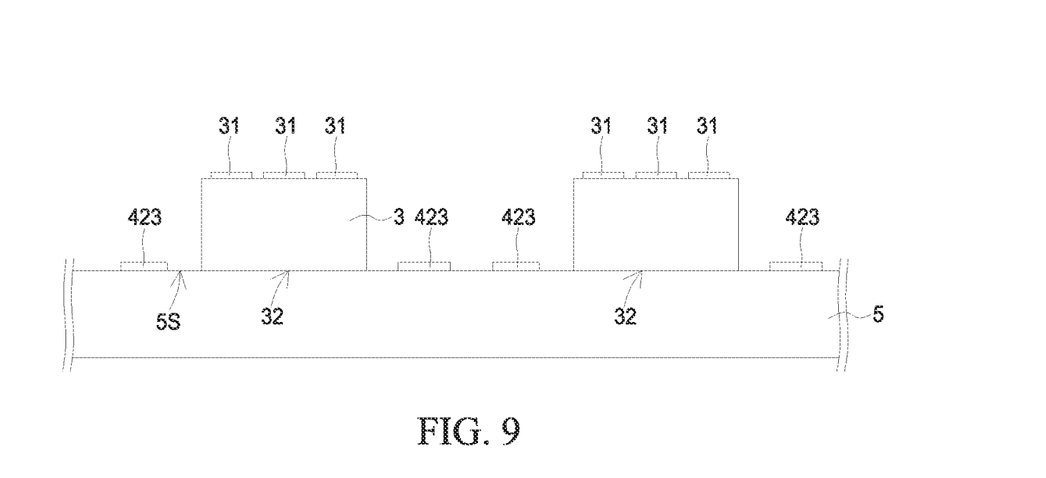

As shown in FIG. 9, a temporary carrier 5 has a surface 5S. The temporary carrier 5 is composed of high temperature resistant materials, such as glass carrier, sapphire substrate, silicon substrate, and bismaleimide triazine (BT) resin carrier, which is able to withstand the subsequent high-temperature processes. The plurality of control chips 3 with the bottom surface 32 are temporarily adhered or affixed to the surface 5S of the temporary carrier 5. In other words, the plurality of electrodes 31 of the control chips 3 face the other side relative to the carrier 5. There is a plurality of bottom electrodes 423 on the surface 5S.

Figure 10:
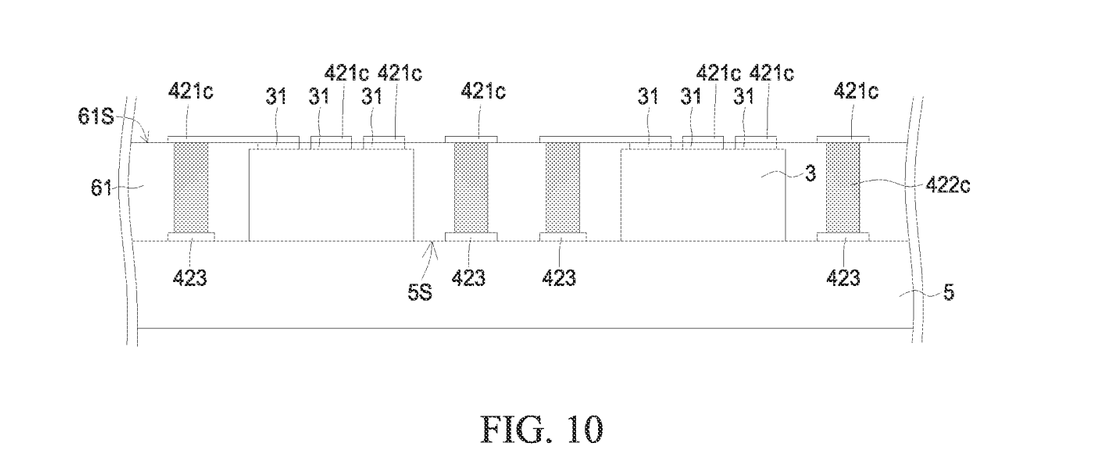

As shown in FIG. 10, an insulating layer 61 covers the surface 5S of the temporary carrier 5, the bottom electrodes 423, and the control chip 3. The plurality of electrodes 31 of the control chip 3 is coplanar with the surface 61S of the insulating layer 61, wherein the material of the insulating layer 61 may be Ajinomoto Build-up Film (ABF), epoxy resin, bismaleimide triazine (BT) resin, or polyimide resin. A plurality of vias is formed in the insulating layer 61 to expose the bottom electrodes 423 by using a patterning process, such as mechanical drilling, wet etching, and dry etching process. The plurality of vias is filled with conductive materials, for example, by electroplating or vapor deposition to fill with metal to form a plurality of third conductive pillars 422*c* connected to the bottom electrodes 423. A patterned lower circuit layer 421*c* is formed on the surface 61S of the insulating layer 61 to connect the electrodes 31 and the plurality of third conductive pillars 422*c*.

Figure 11:
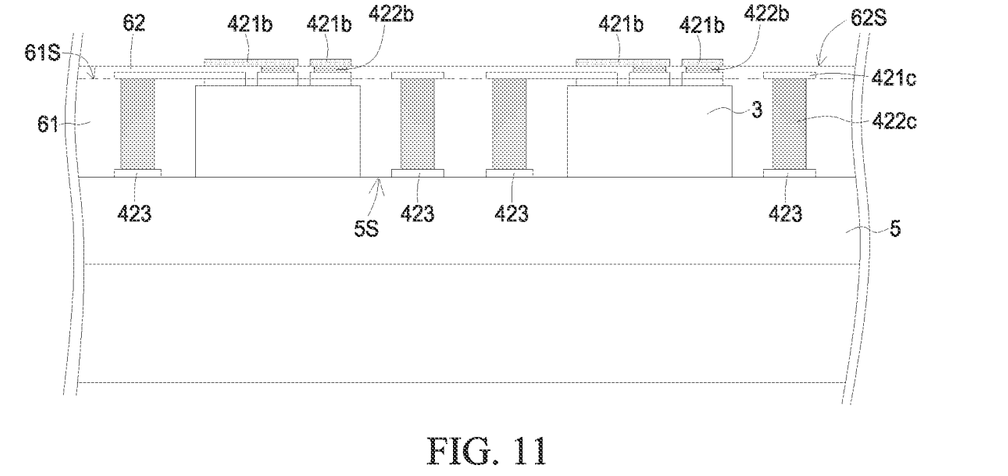

As shown in FIG. 11, an insulating layer 62 having a surface 62S is formed on the surface 61S of the insulating layer 61, wherein the materials of the insulating layer 62 and the insulating layer 61 may be the same or different. The uppermost surface of the insulating layer 62 is higher than the lower circuit layer 421*c*, therefore the insulating layer 62 may cover all the patterned lower circuit layer 421*c*. A plurality of vias is formed in the insulating layer 62 to expose a portion of the lower circuit layer 421*c* by using a patterning process, such as mechanical drilling, wet etching, and dry etching process. The plurality of vias is filled with conductive materials, for example, by electroplating or vapor deposition to fill with metal to form a plurality of second conductive pillars 422*b* connected to the lower circuit layer 421*c*. A patterned middle circuit layer 421*b* is formed on the surface 62S of the insulating layer 62 to connect the plurality of second conductive pillars 422*b*.

Figure 12:
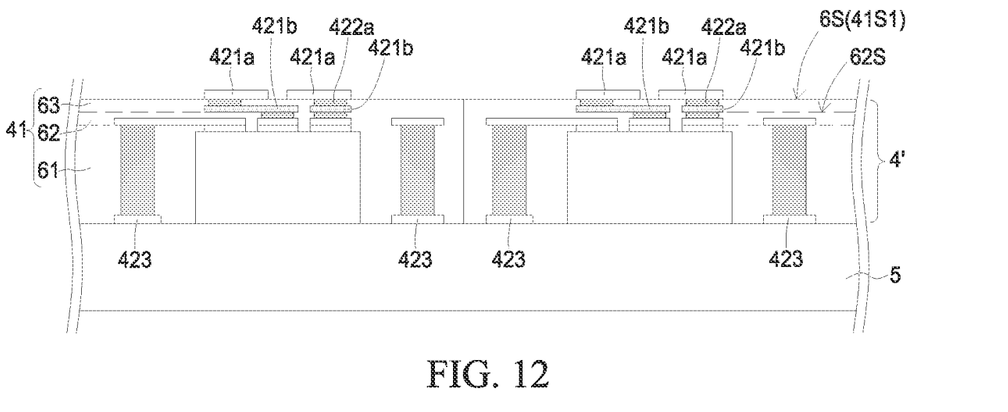

As shown in FIG. 12, an insulating layer 63 having a surface 6S is formed on the surface 62S of the insulating layer 62, wherein the materials of the insulating layer 63 and the insulating layers 61 and 62 may be the same or different. The uppermost surface of the insulating layer 63 is higher than the middle circuit layer 421*b*, therefore the insulating layer 63 may completely cover the patterned middle circuit layer 421*b*. A plurality of vias is formed in the insulating layer 63 to expose a portion of the middle circuit layer 421*b* by using a patterning process, such as mechanical drilling, wet etching, and dry etching process. The plurality of vias is filled with conductive materials, for example, by electroplating or vapor deposition to fill with metal to form a plurality of first conductive pillars 422*a* connected to the middle circuit layer 421b. A patterned upper circuit layer 421a is formed on the surface 6S of the insulating layer 63 to connect the plurality of first conductive pillars 422a, wherein the materials of the insulating layers 61, 62, and 63 may be the same or different. The stacked insulating layers 61, 62, and 63 form the base material 41 of the embedded substrate 4', and the surface 6S of the insulating layer 63 is the upper surface 41S1 of the base material 41.

Figure 13A:
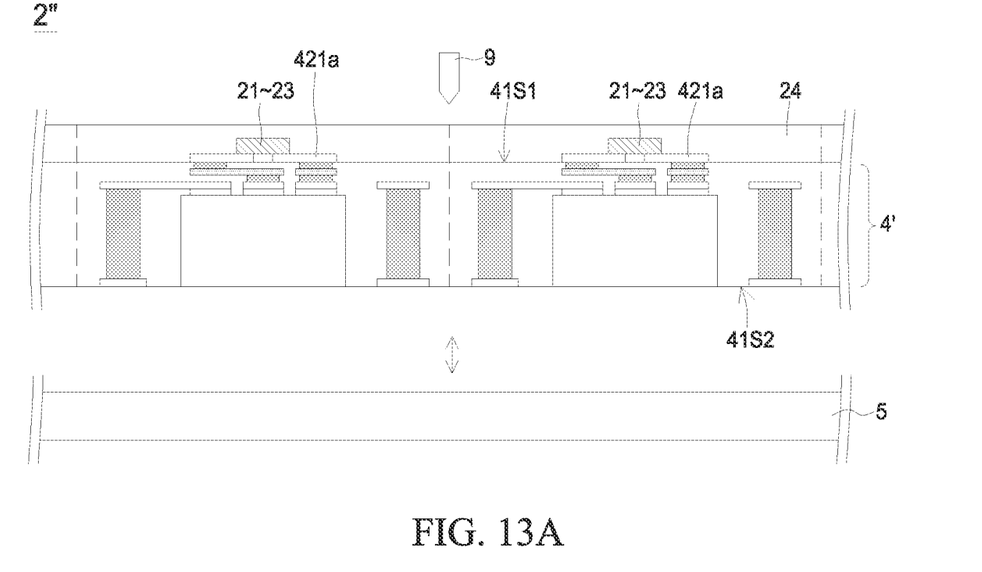

As shown in FIG. 13A, the light-emitting diodes 21, 22, and 23 are disposed on the upper circuit layer 421a, and a light-transmitting protective layer 24 is disposed on the upper surface 41S1 and covers the light-emitting diodes 21, 22, and 23. The temporary carrier 5 is separated from the embedded substrate 4' to expose the lower surface 41S2 of the embedded substrate 4' and to form a temporary device 2". A separation process is performed by using a cutting tool 9, and the temporary device 2" is separated into a plurality of pixel packages 8A as shown in FIG. 4.

Figure 13B:
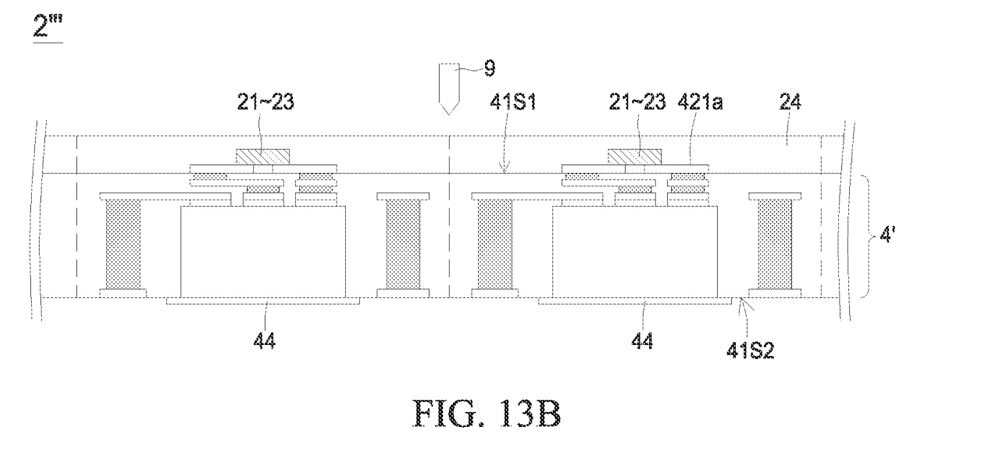
FIG. 13B shows a manufacturing method of the pixel package according to an embodiment.

In another embodiment, as shown in FIG. 13B, after removing the temporary carrier 5 and exposing the lower surface 41S2, the bottom electrodes 423, and the bottom surface 32 of the control chip 3, a solder mask 44 is formed to cover the lower surface 41S2 and the bottom surface 32 of the control chip 3 to form a temporary device 2'''. A separation process is performed by using a cutting tool 9, and the temporary device 2''' is separated into a plurality of pixel packages 8B having the solder mask 44 as shown in FIG. 8.

In an embodiment, the pixel package 8A, the pixel package 8B, or both may be incorporated in the display device 100 shown in FIG. 1 to replace the pixel package 2. The display device 100 using the pixel package 8A, the pixel package 8B, or both has a transparent substrate, and the display device 100 may be applied to certain spaces, such as glass windows of shopping mall, car windows, house windows, and the like.

What is claimed is:

1. A pixel package, comprising:
   a base material having an upper surface, a lower surface, and a side surface between the upper surface and the lower surface;
   a circuit structure in the base material and comprising:
      a first circuit layer exposed from the upper surface,
      a plurality of bottom electrodes exposed from the lower surface,
      a second circuit layer disposed between the first circuit layer and the plurality of bottom electrodes, the second circuit layer is completely covered by the base material, and
      a plurality of conductive pillars connected to the first circuit layer, the second circuit layer, and the plurality of bottom electrodes;
   a plurality of light-emitting elements on the upper surface and electrically connected to the first circuit layer; and
   a non-light-emitting semiconductor element directly connected to the second circuit layer, covered by the base material, and comprising a plurality of electrodes disposed on a top surface of the non-light-emitting semiconductor element and connected to the second circuit layer, wherein a first electrode of the plurality of electrodes is connected to the plurality of light-emitting elements via the second circuit layer, a second electrode of the plurality of electrodes is connected to the plurality of bottom electrodes via the second circuit layer and the plurality of conductive pillars, and the first electrode is physically separated from the second electrode;
   wherein the non-light-emitting semiconductor element has a bottom surface not covered by the base material.

2. The pixel package as claimed in claim 1, wherein the bottom surface of the non-light-emitting semiconductor element is coplanar with or lower than the lower surface of the base material.

3. The pixel package as claimed in claim 1, wherein the non-light-emitting semiconductor element further comprises a top surface and a side surface between the top surface and the bottom surface, and the side surface and the top surface are in direct contact with the base material.

4. The pixel package as claimed in claim 1, wherein as viewed from the lower surface of the base material, the plurality of bottom electrodes surrounds the bottom surface of the non-light-emitting semiconductor element.

5. The pixel package as claimed in claim 1, further comprising a light-transmitting protective layer covering the plurality of light-emitting elements and in direct contact with the upper surface of the base material.

6. The pixel package as claimed in claim 5, wherein a material of the light-transmitting protective layer is resin, ceramic, glass, or a combination thereof, and transmittance of the light-transmitting protective layer to all wavelength bands of wavelengths from 430 nm to 480 nm, 510 nm to 560 nm, and 600 nm to 660 nm are greater than 50%.

7. The pixel package as claimed in claim 1, wherein the non-light-emitting semiconductor element controls the plurality of light-emitting elements to emit red, blue, and green light.

8. The pixel package as claimed in claim 1, wherein the base material comprises ABF, epoxy resin, BT resin, polyimide resin, or epoxy resin.

9. The pixel package as claimed in claim 1, wherein the base material has a coefficient of thermal expansion between 1 and 100 ppm/° C.

10. The pixel package as claimed in claim 1, wherein a difference in coefficient of thermal expansion between the base material and the non-light-emitting semiconductor element is less than 10 ppm/° C.

11. The pixel package as claimed in claim 1, wherein the circuit structure is integrated with the non-light-emitting semiconductor element.

12. The pixel package as claimed in claim 1, further comprising a solder mask covering the lower surface and exposing the plurality of bottom electrodes.

13. The pixel package as claimed in claim 12, wherein the solder mask comprises epoxy resin or polyimide resin.

14. The pixel package as claimed in claim 1, wherein the plurality of bottom electrodes is coplanar with or lower than the bottom surface of the non-light-emitting semiconductor element.

15. The pixel package as claimed in claim 1, wherein the non-light-emitting semiconductor element is configured to receive a data signal via the second electrode, the second circuit layer and the plurality of conductive pillars.

* * * * *